United States Patent
Chan et al.

(10) Patent No.: US 10,218,272 B2
(45) Date of Patent: Feb. 26, 2019

(54) CONTROL CIRCUIT AND CONTROL METHOD FOR SWITCH POWER SUPPLY, AND SWITCH POWER SUPPLY

(71) Applicant: JOULWATT TECHNOLOGY (HANGZHOU) CO., LTD., Hangzhou, Zhejiang (CN)

(72) Inventors: Siopang Chan, Zhejiang (CN); Pitleong Wong, Zhejiang (CN); Yuancheng Ren, Zhejiang (CN); Xunwei Zhou, Zhejiang (CN)

(73) Assignee: Joulwatt Technology (Hangzhou) Co. LTD., Hangzhou (CN)

( * ) Notice: Subject to any disclaimer, the term of this patent is extended or adjusted under 35 U.S.C. 154(b) by 0 days.

(21) Appl. No.: 15/786,225

(22) Filed: Oct. 17, 2017

(65) Prior Publication Data

US 2018/0109191 A1 Apr. 19, 2018

(30) Foreign Application Priority Data

Oct. 19, 2016 (CN) .......................... 2016 1 0907264

(51) Int. Cl.
| | |
|---|---|
| *H02M 3/158* | (2006.01) |
| *H02J 3/38* | (2006.01) |
| *H02J 3/44* | (2006.01) |
| *H02M 3/335* | (2006.01) |
| *H02M 7/48* | (2007.01) |
| *H03K 17/06* | (2006.01) |
| *H03K 17/56* | (2006.01) |
| *H02M 3/156* | (2006.01) |

(52) U.S. Cl.
CPC ............. *H02M 3/1582* (2013.01); *H02J 3/38* (2013.01); *H02J 3/44* (2013.01); *H02M 3/1563* (2013.01); *H02M 3/335* (2013.01); *H02M 7/48* (2013.01); *H03K 17/063* (2013.01); *H03K 17/56* (2013.01)

(58) Field of Classification Search
CPC ................. H02M 3/156; H02M 3/158; H02M 2003/156; H02M 2003/158
See application file for complete search history.

(56) References Cited

U.S. PATENT DOCUMENTS

| | | | | |
|---|---|---|---|---|
| 7,268,526 B1* | 9/2007 | Smith | ................... | H02M 3/156 323/284 |
| 7,619,395 B2* | 11/2009 | Mok | ..................... | H02M 3/156 323/224 |

(Continued)

*Primary Examiner* — Matthew Nguyen
(74) *Attorney, Agent, or Firm* — Kunzler, PC

(57) ABSTRACT

For controlling a switch power supply, an adjustment module produces a first control voltage by comparing a period of a switch signal with a reference period. A current source module generates a first charging current according to the first control voltage. A pulse signal generating module converts the first charging current into an on time signal or off time signal of a switch transistor. A driving module produces the switch signal according to the on time or off time signal of the switching transistor, so as to control the turn on and turn off signal of a switching transistor. A time measurement module obtains a time parameter according to the switch signal, and generates a periodic adjustment signal according to the time parameter. The adjustment module adjusts the reference period according to the periodic adjustment signal to adjust the period of the switch signal.

18 Claims, 12 Drawing Sheets

(56) References Cited

U.S. PATENT DOCUMENTS

2011/0273156 A1* 11/2011 Miyamae ............ H02M 3/156
                                                    323/288
2016/0351146 A1* 12/2016 Takenaka ............ H02M 3/157

* cited by examiner

CONTROL CIRCUIT AND CONTROL METHOD FOR SWITCH POWER SUPPLY, AND SWITCH POWER SUPPLY

CROSS-REFERENCE TO RELATED APPLICATION

This application claims the benefit of Chinese Patent Application No. 201610907264.4, filed on Oct. 19, 2016, which is incorporated herein by reference in its entirety.

FIELD

The present disclosure relates to the field of power electronics, and more particularly, to a control circuit and a control method for a switch power supply, and a switch power supply.

BACKGROUND

The switch power supply uses the switch signals to control the turn-on and turn-off of the switching transistors, and maintains the stable output of the power circuit through the charging and discharging of the energy storage element. In the switch power supply, the control circuit generates switch signals to control the turn-on and turn-off of the switching transistors. The ratio of the on time of the switching transistor to the whole switching period is called duty period. There is a specific relationship between and among the input voltage, the output voltage and the duty ratio of the switch power supply. Therefore, the stable output voltage can be obtained by the feedback adjustment of the duty period when the input voltage fluctuates, and the voltage regulation range of the switch power supply is limited by the range of the duty range.

The constant time control method of switch power supply includes constant on time control and constant off time control. Wherein, the constant on time control method achieves the conversion of the input voltage to an output voltage to drive the load by controlling the turn on of the switch power supply switching transistor at a constant time; the constant off time control method achieves the conversion of the input voltage to an output voltage to drive the load by controlling the turn off of the switch power supply switching transistor at a constant time. Generally, the operational amplifier, comparator and driver module of the control circuit need a certain time to detect and operate, so the off time of the switch signal should be greater than or equal to the minimum off time, and the on time of the switch signal should be greater than or equal to the minimum on time.

The maximum value of the duty period is limited in the constant on time control due to the minimum off time, and the minimum value of the duty period is limited in the constant off time control due to the minimum on time. So, the range of the input voltage and the output voltage of the switch power supply is limited.

Therefore, an expanded range of the input voltage and the output voltage is expected to be further realized.

BRIEF SUMMARY

In view of this, an objective of the disclosure is to provide a control circuit and a control method for a switch power supply, and a switch power supply, by which the control circuit adjusts the reference period according to the time parameter.

According to a first aspect, the disclosure provides a control circuit for a switch power supply comprising:

an adjustment module that produces a first control voltage by comparing a period of a switch signal with a reference period;

a current source module that generates a first charging current according to the first control voltage;

a pulse signal generating module that converts the first charging current into an on time signal or off time signal of a switch transistor;

a driving module that produces the switch signal according to the on time or off time signal of the switching transistor, so as to control the turn on and turn off signal of a switching transistor;

a time measurement module that obtains a time parameter according to the switch signal, and generates a periodic adjustment signal according to the time parameter;

and wherein the adjustment module adjusts the reference period according to the periodic adjustment signal to adjust the period of the switch signal.

In one embodiment, in constant on time control mode of the switch power supply, the time measurement module includes an off time measurement circuit for measuring the off time of the switch signal as the time parameter, and when the off time is less than the first threshold, the periodic adjustment signal makes the reference period increase.

In one embodiment, in constant off time control mode of the switch power supply, the time measurement module includes a on time measurement circuit, and when the on time is less than the second threshold, the periodic adjustment signal make the reference period increase.

In one embodiment, the adjustment module includes: that generates a reference period signal according to the switch signal, wherein the reference period signal is a pulse signal that is triggered synchronously with the switch signal; an edge comparison module that compares the reference period signal with the switch signal to generate a first enable signal and a second enable signal; a compensation module that provides the first control voltage and adjusts the first control voltage in accordance with the first enable signal and the second enable signal.

In one embodiment, the timing module includes: a first capacitor that generates a second control voltage across the first capacitor; a first current source that is connected in series with the first capacitor for supplying a first current to the first capacitor; a first capacitor that generates a second control voltage across the first capacitor; a first switch that is connected in parallel with the first capacitor and controls the charging and discharging process of the first capacitor; a first comparator that produces the reference period signal by comparing the second control voltage with a first reference voltage; wherein the first switch is turned on and off by the switch signal, and the timing module adjusts the reference period by changing a charging time of the first capacitor.

In one embodiment, the adjustment module further comprises a first voltage source for providing the first reference voltage. When the adjustment module increases the reference period, at least one of a current of the first current source is reduced and the first reference voltage is raised, and subsequently a charging time of the first capacitor is extended. When the adjustment module reduces the reference period, at least one of the current of the first current source is increased and the first reference voltage is reduced, and subsequently the charging time of the first capacitor is reduced.

According to a second aspect, the disclosure provides a control method for a switch power supply, comprising: generating a switch signal to control the turn on and the turn off of the switching transistors; producing a periodic adjustment signal based on the switch signal; and adjusting a period of the switch signal in accordance with the periodic adjustment signal.

In one embodiment, generating a switch signal includes: producing a first control voltage by comparing the period of the switch signal with a reference period; generating a first charging current according to the first control voltage; generating a on time or off time signal of the switching transistor in accordance with the first charging current; producing the switch signal based on the on time or off time signal of the switching transistor, wherein adjusting the period of the switch signal comprises adjusting the reference period according to the periodic adjustment signal.

In one embodiment, producing a periodic adjustment signal comprises: obtaining a time parameter in accordance with the switch signal and generating the periodic adjustment signal according to the time parameter.

In one embodiment, in constant on time control mode of the switch power supply, the time parameter is the off time of the switch signal, and when the off time is less than the first threshold, the periodic adjustment signal increases the reference period.

In one embodiment, in constant off time control mode of the switch power supply, the time parameter is the on time of the switch signal, and when the on time is less than the second threshold, the periodic adjustment signal increases the reference period.

According to a third aspect, the disclosure provides a switch power supply comprises: a main circuit and each of the above control circuit for a switch power supply. The main circuit includes a switching transistor and the control circuit controls the turn-on and turn-off of the switching transistor.

In one embodiment, the main circuit is either a boost topology, a buck topology, a buck-boost topology, or a flyback topology.

The control circuit of the switch power supply of the present invention uses dynamic control of the reference period to compensate the change of the event parameter of switch signal, thereby realizing the wide input and output voltage range and improving the system stability.

In one embodiment, in constant on time control mode of the switch power supply, if the off time is less than the first threshold, the reference period is extended. The first threshold corresponds to the minimum off time. The reference period is dynamically adjusted by the off time of the switch signal so that the off time is always greater than the minimum off time. Therefore, the control method compensates for the change of the off time of the switch signal by dynamically controlling the reference period, which can further improve the maximum value of duty ratio Dmax to realize a wide input and output voltage range.

In one embodiment, in constant on time control mode of the switch power supply, if the off time is greater than or equal to the first threshold, the reference period decreases. The reference period is dynamically adjusted by the off time of the switch signal. When the off time of the switch signal is greater than the minimum off time, the control circuit further increases the frequency of the switch signal, thus the system efficiency is improved and the generation of the audio noise is avoided.

In one embodiment, in constant off time control mode of the switch power supply, if the on time is less than the second threshold, the reference period is extended. The second threshold corresponds to the minimum on time. The reference period is dynamically adjusted by the on time of the switch signal so that the on time is always greater than the minimum on time. Therefore, the control method compensates the change of the on time of the switch signal by dynamically controlling the reference period, which can further reduce the minimum value of duty ratio Dmin to realize a wide input and output voltage range.

In one embodiment, in constant off time control mode of the switch power supply, if the on time is greater than or equal to the second threshold, the reference period decreases. The reference period is dynamically adjusted by the on time of the switch signal. When the on time of the switch signal is greater than the minimum on time, the control circuit further increases the frequency of the switch signal, thus the system efficiency is improved and the generation of the audio noise is avoided.

BRIEF DESCRIPTION OF THE DRAWINGS

The advantages and features of the present embodiments will become more fully understood from the detailed description given herein below in connection with the appended drawings, and wherein.

DETAILED DESCRIPTION OF THE DISCLOSURE

Reference will now be made in detail to particular embodiments of the disclosure, examples of which are illustrated in the accompanying drawings. It will be understood that the disclosure is not limited to these examples. On the contrary, the disclosure is intended to cover alternatives, modifications and equivalents that may be included within the spirit and scope of the disclosure as defined by the appended claims.

Furthermore, in the following detailed description of the present disclosure, numerous specific details are set forth in order to provide a thorough understanding of the present disclosure. However, it will be readily apparent to one skilled in the art that the present disclosure may be practiced without these specific details.

Reference will now be made in detail to particular embodiments of the disclosure, examples of which are illustrated in the accompanying drawings. The accompanying drawings are illustrative and not intended to be limiting, but are examples of embodiments of the invention, which are simplified for explanatory purposes and are not drawn to scale. In addition, some well-known portions may not be shown in the figures.

Figure 1:
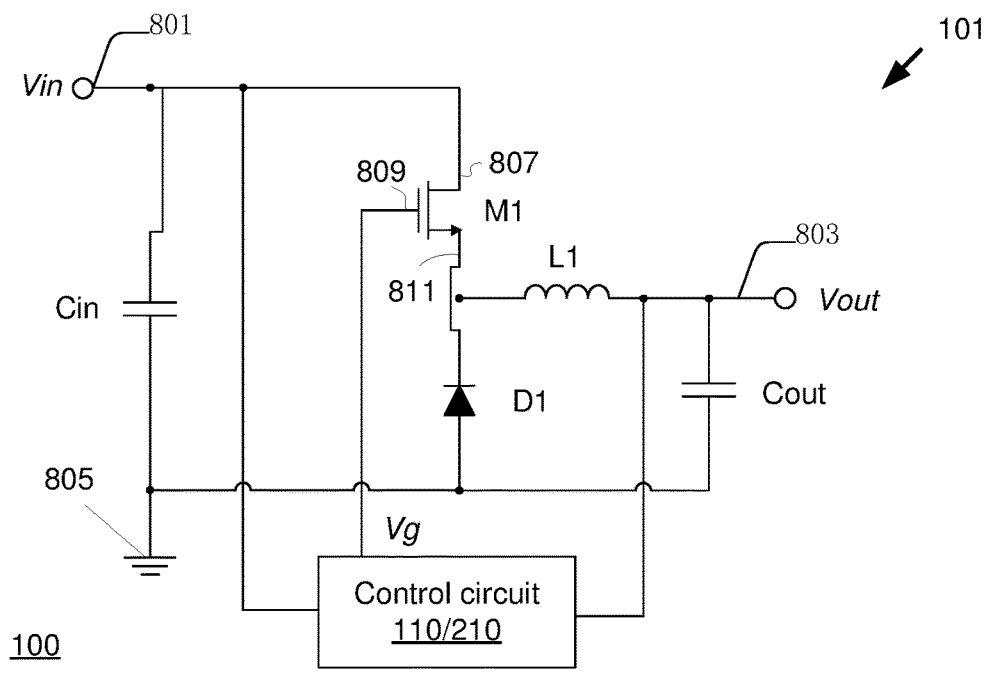
FIG. 1 is a schematic block diagram of one embodiment of a buck circuit for a switch power supply.

FIG. 1 shows a buck circuit for a switch power supply 100. In FIG. 1, the switch power supply 100 has an input terminal 801 for receiving the DC input voltage Vin and an output terminal 803 for supplying the DC output voltage Vout. The main circuit 101 of the switch power supply 100 includes capacitors Cin and Cout, a switching transistor M1, a diode D1 and an inductor L1 and excludes the control circuit 110/210. The control circuit 110 of the switch power supply 100 supplies the switch signal Vg to the switching transistor M1.

In the main circuit 101 of the switch power supply 100, the capacitor Cin is connected between the input terminal 801 and the ground 805 for filtering the DC input voltage Vin; the capacitor Cout is connected between the output terminal 803 and the ground 805 to provide the DC output voltage Vout. The switching transistor M1 and the diode D1 are connected in series between the input terminal 801 and the ground 805. The switching transistor M1 has a first end 807, a second end 811, and a control end 809. The control end 809 of the switching transistor M1 receives the switch signal Vg, and the current flows from the first end 807 to the second end 811 when the switching transistor M1 is turned on. The anode of the diode D1 is grounded and the cathode is connected to the second end 811 of the switching transistor M1. The inductor L1 is connected between the common node of the second end 811 switching transistor M1 and the diode D1 and the output terminal 803.

The switching transistor M1, for example, is a kind of metal oxide semiconductor field effect transistor (MOSFET) and bipolar transistor. Such as the switching transistor M1 is an N-type MOSFET, the first end 807, the second end 811, and the control end 809 are the drain, the source and the gate, respectively.

The control circuit 110 of the switch power supply 100 is connected to the input terminal 801 and the output terminal 803 of the main circuit 101 and the control end of the switching transistor M1, respectively. The control circuit 110 includes some circuit such as a comparator and a pulse signal generating module. The control circuit 110 uses the DC input voltage Vin supplied by the input terminal 801 and the DC output voltage Vout supplied by the output terminal 803 to generate a supply voltage and/or a reference voltage to the internal circuit module. In addition, the DC input voltage Vin and the DC output voltage Vout further provide a feedback signal, and the control circuit 110 generates the switch signal Vg according to the feedback signal to control the on time and the off time of the switching transistor M1 in each switch period, i.e., to adjust the duty ratio so that the DC output voltage is substantially constant.

During the on time of the switching transistor M1, the voltage of the common node of the switching transistor M1 and the diode D1 is approximately equal to the DC input voltage Vin, and the diode D1 is turned off in reverse. The DC input voltage Vin is charged to the inductor L1 via the switching transistor M1, and the inductor current IL flows through the inductor L1 and linearly increases. At the same time, the DC input voltage Vin charges the capacitor Cout and the DC output voltage Vout is generated at both ends of the capacitor Cout.

During the off time of the switching transistor M1, the inductor current IL still flows through the inductor L1 and linearly decreases because of the characteristic of the inductor current IL. The polarity of the two ends of the inductor L1 changes so that the diode D1 is conducting in the forward direction. The capacitor Cout discharges to maintain the DC output voltage Vout.

In the Buck-type switch power supply, the DC output voltage Vout and the DC input voltage Vin is related to the duty ratio D of the switch signal Vg, i.e., Vout=Vin*D.

Figure 2:
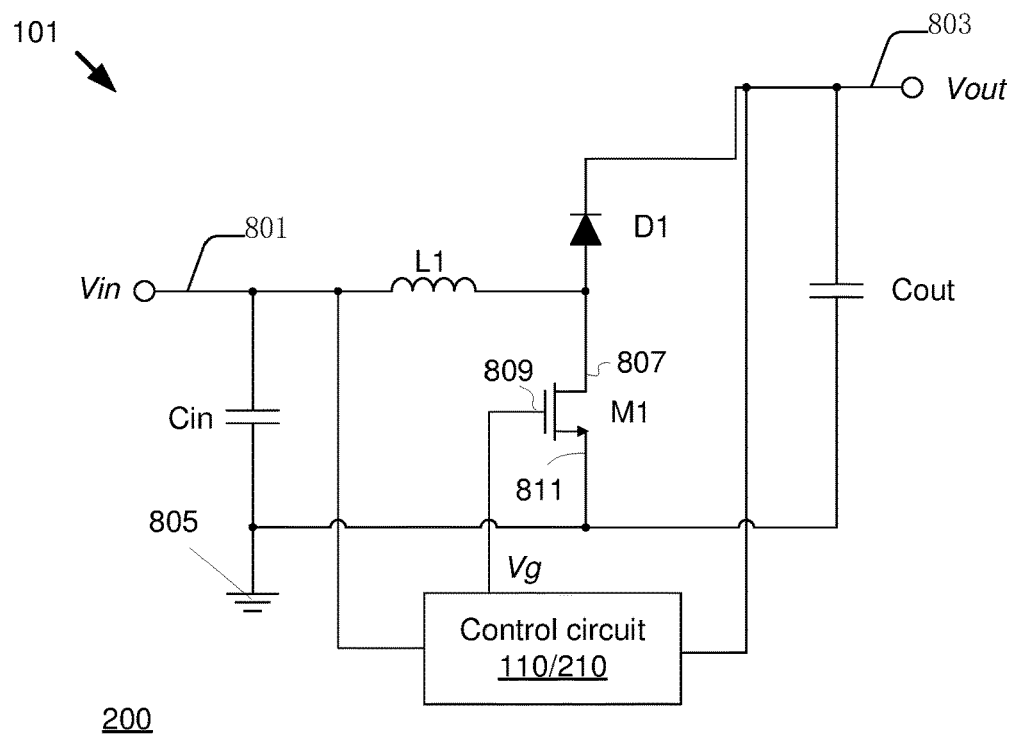
FIG. 2 is a schematic block diagram of one embodiment of a boost circuit for a switch power supply.

FIG. 2 shows a Boost circuit for a switch power supply 200. In FIG. 2, the switch power supply 200 has an input terminal 801 for receiving the DC input voltage Vin and an output terminal 803 for supplying the DC output voltage Vout. The main circuit 101 of the switch power supply 200 includes capacitors Cin and Cout, a switching transistor M1, a diode D1 and an inductor L1 and excludes the control circuit 110/210. The control circuit 210 of the switch power supply 200 supplies the switch signal Vg to the switching transistor M1.

In the main circuit 101 of the switch power supply 200, the capacitor Cin is connected between the input terminal 801 and the ground 805 for filtering the DC input voltage Vin. The capacitor Cout is connected between the output terminal 803 and the ground 805 to provide the DC output voltage Vout. The switching transistor M1 and the diode D1 are connected in series between the input terminal 801 and the ground 805. The switching transistor M1 has a first end 807, a second end 811, and a control end 809. The control end 809 of the switching transistor M1 receives the switch signal Vg, and the current flows from the first end 807 to the second end 811 when the switching transistor M1 is turned on. The anode of the diode D1 is connected to the common node of the inductor L1 and the second end 811 of the switching transistor M1 and the cathode is connected to the output terminal 803.

The control circuit 210 of the switch power supply 200 is connected to the input terminal 801 and the output terminal 803 of the main circuit 101 and the control end 809 of the switching transistor M1, respectively. The control circuit 210 includes some circuit such as a comparator and a pulse signal generating module. The control circuit 210 uses the DC input voltage Vin supplied by the input terminal and the DC output voltage Vout supplied by the output terminal 803 to generate a supply voltage and/or a reference voltage to the internal circuit module. In addition, the DC input voltage Vin and the DC output voltage Vout further provide a feedback signal, and the control circuit 210 generates a switch signal Vg according to the feedback signal to control the on-time and the off-time of the switching transistor M1 in each switch period, i.e., to adjust the duty ratio so that the DC output voltage Vout is substantially constant.

During the on time of the switching transistor M1, the common node of the inductor L1 and the second end 811 of the switching transistor M1 is connected to the ground across the switching transistor M1, and the diode D1 is turned off in reverse. The DC input voltage Vin is charged to the inductor L1, and the inductor current IL flows through the inductor L1 and linearly increases. The diode D1 prevents the capacitor Cout from discharging through the switching transistor M1 so as to maintain the DC output voltage Vout at both ends of the capacitor Cout.

During the off time of the switching transistor M1, the inductor current IL still flows through the inductor L1 and linearly decreases because of the characteristic of the inductor current IL. The polarity of the two ends of the inductor L1 changes so that the diode D1 is conducting in the forward direction. At the same time, the DC output voltage Vout at both ends of the capacitor Cout is greater than the DC input voltage Vin.

In the Boost-type switch power supply, the DC output voltage Vout and the DC input voltage Vin is related to the duty ratio D of the switch signal Vg, i.e., Vout=Vin/D.

The working principle of the circuit in constant on time control mode of the switch power supply is described below.

Figure 3:
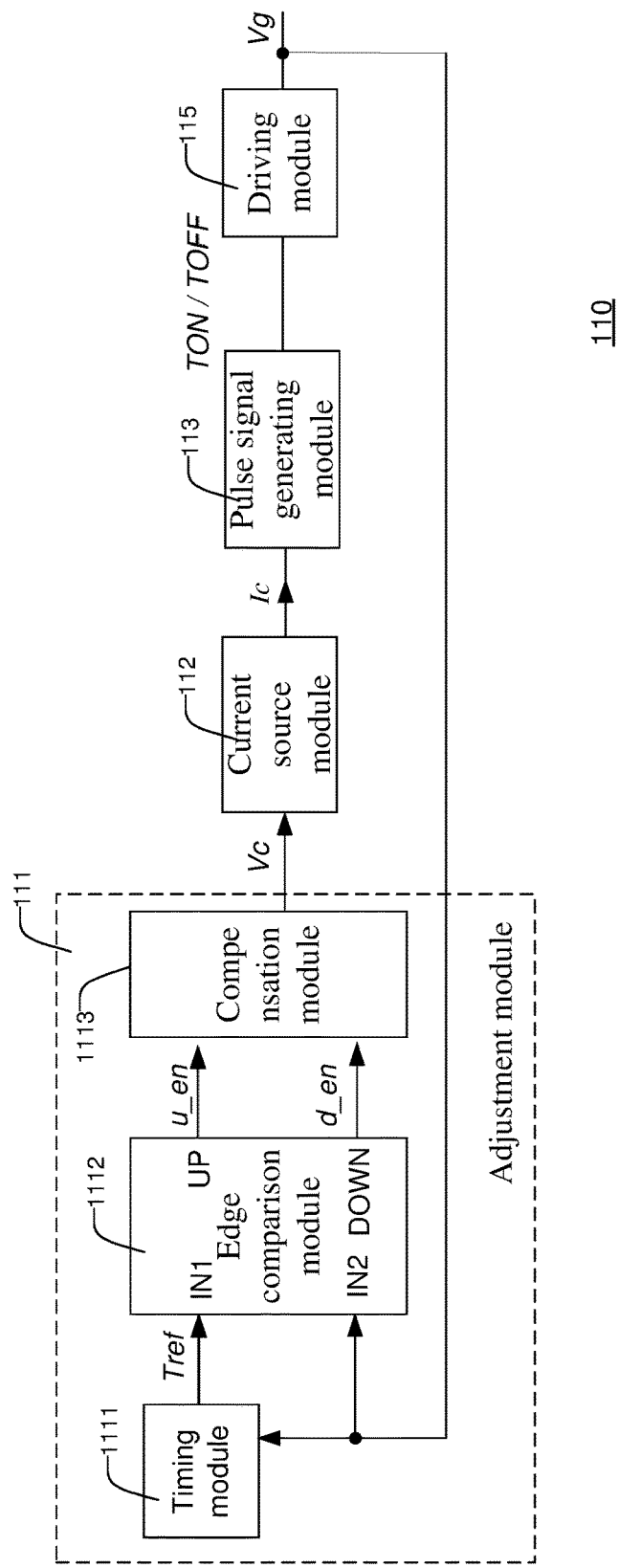
FIG. 3 is a schematic block diagram of one embodiment of a control circuit used in a switch power supply.

FIG. 3 is a schematic block diagram of prior art control circuit 110 used in switch power supplies 100/200 shown in FIG. 1-2. As shown in FIG. 3, the control circuit 110 includes an adjustment module 111, a current source module 112, a pulse signal generating module 113, and a driving module 115. The adjustment module 111 generates a control voltage Vc according to the switch signal Vg. The current source 112 produces a charging current Ic based on the control voltage Vc. The pulse signal generating module 113 generates a switch turn-on signal TON in accordance with the charging current Ic. The driving module 115 generates a switch signal Vg based on the switch turn-on signal TON. In constant on time control mode of the switch power supply, the pulse signal generating module 113 generates a switch turn-off signal TOFF in accordance with the charging current Ic. The driving module 115 generates a switch signal Vg based on the switch turn-off signal TOFF.

The adjustment module 111 includes a timing module 1111, an edge comparison module 1112, and a compensation module 1113. The timing module 1111 receives the switch signal Vg and generates a reference period signal Tref based on the switch signal Vg. The input terminals IN1 and IN2 of the comparison module 1112 receive the reference period signal Tref and the switch signal Vg, respectively. A up-enable signal u_en and a down-enable signal d_en are obtained by comparing the reference period signal Tref with the switch signal Vg. The compensation module 1113 is used to produce the control voltage Vc and adjust the control voltage Vc in accordance with the up-enable signal u_en or a down-enable signal d_en.

During the operation of the control circuit 110, the adjustment module 111 performs the following operations in a plurality of successive periods of the switch signal Vg.

At time t0, the switch signal Vg translates from the low level to the high level, and starts a new period. The timing module 1111 starts counting from the rising edge of the switch signal Vg and generates the reference period signal Tref.

At time t2, the rising edge of the next switch signal Vg is received by the second input terminal IN2 of the edge comparison module 1112 after a period T of the switch signal Vg.

The level of the switch turn-on signal TON of the first input terminal IN1 of the edge comparison module 1112 is related to the actual period T of the switch signal Vg. When the actual period T of the switch signal Vg is smaller than the reference period, the reference period signal Tref outputs from the timing module 1111 is at a low level at time t2. When the actual period T of the switch signal Vg is greater than the reference period, the reference period signal Tref outputs from the timing module 1111 is at a high level at time t2.

The edge comparison module 1112 compares the reference period signal Tref detected by the first input terminal IN1 with the switch signal Vg detected by the second input terminal IN2. At time t1, if the reference period signal Tref is at a high level, the up-enable signal u_en supplied form the first output terminal UP of the edge comparison module 1112 is valid, and the down-enable signal d_en provided by the second output terminal DOWN of the edge comparison module 1112 is invalid. On the other hand, if the reference period signal Tref detected by the first input terminal IN1 of the edge comparison module 1112 is at a low level, the up-enable signal u_en supplied form the first output terminal UP of the edge comparison module 1112 is invalid, and the down-enable signal d_en provided by the second output terminal DOWN of the edge comparison module 1112 is valid.

The compensation module 1113 adjusts the control voltage Vc according the up-enable signal u_en and the down-enable signal d_en. If the up-enable signal u_en is valid, the control voltage Vc outputted from the current source module 112 increases the predetermined value by the compensation module 1113. If the down-enable signal d_en is valid, the control voltage Vc outputs from the current source module 112 reduces the predetermined value by the compensation module 1113.

The current source module 112 receives the control voltage Vc and adjusts the charging current Ic based on the control voltage Vc. If the control voltage Vc rises, the charging current Ic rises the predetermined value, and if the control voltage Vc reduces, the charging current Ic reduces the predetermined value.

In one embodiment, the current source module 112 includes a voltage-to-current conversion module which converts the control voltage Vc to a charging current IC in a certain proportion. In an alternative embodiment, the current source module 112 includes a controlled current source, i.e., the control voltage VC as a control signal, which changes the charging current IC by controlling the current source.

In constant on time control mode of the switch power supply, the pulse signal generating module 113 charges and discharges the capacitor Cout using the charging current Ic to generate the switch turn-on signal TON. The driving module 115 produces the switch signal Vg based on the switch turn-on signal TON. The period of the switch signal Vg is related to the charging current Ic, so the switch signal Vg can be adjusted by controlling the charging current Ic. In constant on time control mode, the pulse signal generating module 113 charges and discharges the capacitor Cout using the charging current Ic to generate the switch turn-off signal TOFF. The driving module 115 generates the switch signal Vg based on the switch turn-off signal TOFF.

In the plurality of successive periods of the switch signal Vg, the control circuit 110 repeats the above process so that the period of the switch signal Vg gradually approaches the reference period, and finally the stable switch period T is achieved.

Figure 4:
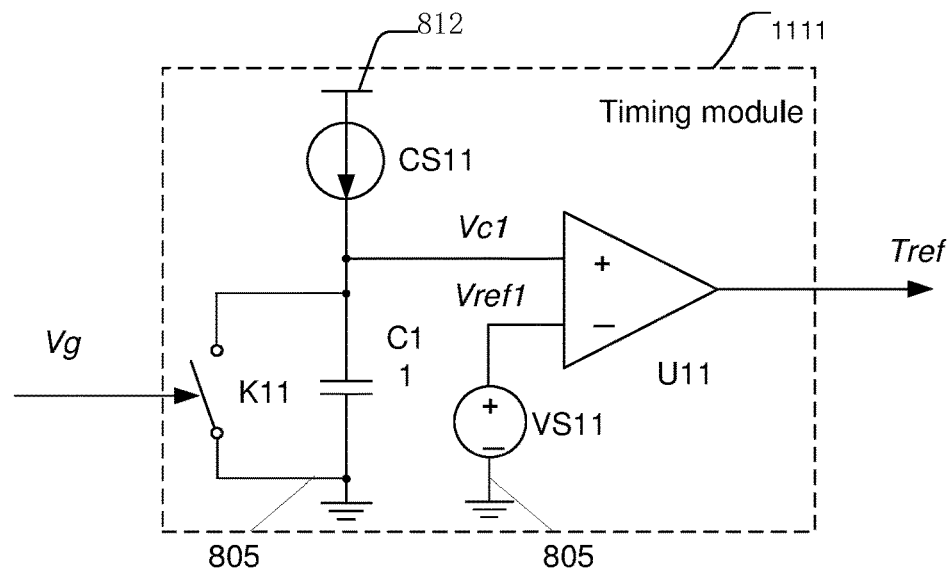
FIG. 4 is a schematic block diagram of one embodiment of a timing module used in the control circuit shown in FIG. 2.

FIG. 4 given a schematic block diagram of a timing module 1111 used in the control circuit 110 shown in FIG. 3. The timing module 1111 includes a comparator U11, a voltage source VS11, a current source CS11, a capacitor C11, and a switch K11.

The current source CS11 and the capacitor C11 are connected in series between the power supply terminal 812 and the ground 805, the common node of the current source CS11 and the capacitor C11 generates a control voltage Vc1. The switch K11 and the capacitor C11 are connected in parallel, and the switch K11 is turned on and turned off under the control of the switch signal Vg.

The noninverting input terminal of the comparator U11 is connected to the common node of the current source CS11 and the capacitor C11 to receive the control voltage Vc1, and the inverting input terminal is connected to the voltage source VS11 to receive the reference voltage Vref1. The output terminal of the comparator U11 is connected to the edge comparison module 1112 to provide the reference period signal Tref to the edge comparison module 1112.

During the operation of the control circuit 110, the timing module 1111 performs the following operations in a plurality of successive periods of the switch signal Vg.

At time t0, the switch signal Vg translates from the low level to the high level, and starts a new period. The switch K11 is turned on under the control of the switch signal Vg, and the capacitor C11 starts discharging. The control voltage Vc1 generated by the common node of the current source CS11 and the capacitor C11 is zero. The on time of the switch K11 is shorter than the on time of a MOS, such as 30 ns. At this time, the voltage of the capacitor C11 is reset to zero. The switch K11 is turned off and the current source CS11 changes the capacitor C11. The control voltage Vc1 generated by the common node of the current source CS11 and the capacitor C11 gradually increases.

At time t1, the switch signal Vg translates from the high level to the low level, and at time t2, the switch signal Vg translates from the low level to the high level.

In the time period of t1 to t2, the switch signal Vg is at the low level stage, and the switching transistor M1 of the main circuit 101 of the switch power supply 100/200 is turned off under the control of the switch signal Vg. The low level stage corresponding to the turn-off stage of the switching transistor M1 so that the time period of the low level stage corresponding to the off time Tf of the switching transistor M1. At time t2, the switch signal Vg starts the next period, the switch K11 is turned on under the control of the switch signal Vg, and the capacitor C11 re starts discharging.

In the plurality of successive periods of the switch signal Vg, the timing module 1111 repeats the above process.

The voltage source VS11 of the timing module 1111 provides a reference voltage Vref1 for characterizing the reference period of the switch signal Vg. The comparator U11 compares the control voltage Vc1 with the reference voltage Vref1 so as to provide a reference period signal Tref at the output terminal.

If the maximum voltage of the control voltage Vc1 rises to the reference voltage Vref1, this indicates that the period T of the switch signal Vg is the same as the reference period set in the timing module 1111. At the end of the off time Tf (i.e., the above-mentioned time t2), the reference period signal Tref and the switch signal Vg are inverted simultaneously, i.e., from the low level to the high level.

If the maximum voltage of the control voltage Vc1 is smaller than the reference voltage Vref1, it indicates that the period T of the switch signal Vg is smaller than the reference period set in the timing module 1111. At the end of the off time Tf (i.e., the above-mentioned time t2), the switch signal Vg is turned over and the reference period signal Tref is not inverted, i.e., the switch signal Vg translates from the low level to the high level and the reference period Tref is still maintained low level.

If the maximum voltage of the control voltage Vc1 rises to the reference voltage Vref1 before the end of the off time Tf, this indicates that the period T of the switch signal Vg is greater than the reference period set in the timing module 1111. At the end of the off time Tf (i.e., the above-mentioned time t2), the switch signal Vg is turned over i.e., the switch signal Vg translates from the low level to the high level. The reference period Tref translates from the low level to the high level before the end of the off time Tf, and remains at the high level at the end of the off time Tf.

The different level states of the reference period Tref generated by the timing module 1111 represent the comparison result of the switch signal Vg with the reference period. As described above, when the reference period Tref and the switch signal Vg are inverted simultaneously, this indicates that the period of the switch signal Vg is equal to the reference period. When the reference period Tref is turned over before the switch signal Vg, this indicates that the period of the switch signal Vg is greater than the reference period. When the reference period Tref is not inverted, this indicates that the period of the switch signal Vg is smaller than the reference period.

Figure 5:
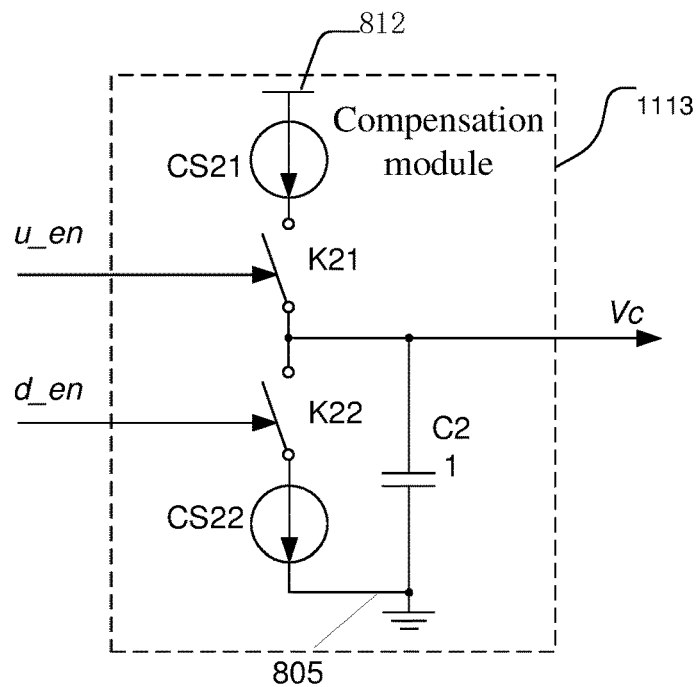
FIG. 5 is a schematic block diagram of one embodiment of a compensation module used in the control circuit shown in FIG. 2.

FIG. 5 is a schematic block diagram of a compensation module 1113 used in the control circuit 110 shown in FIG. 3. The compensation module 1113 includes a current source CS21, a current source CS22, a switch K21, a switch K22, and a capacitor C21. The current source CS21, the switch K21, the switch K22 and the current source CS22 are connected successively in series between the power supply terminal 812 and the ground 805. The switch K21 is turned and turned off under the control of the up-enable signal u_en, and the switch K22 is turned and turned off under the control of down-enable signal d_en. The capacitor C21 is connected between the common node of the switch K21 and switch K22 and the ground 805. A control voltage Vc in generated across the capacitor C21.

During the operation of the control circuit 110, the compensation module 1113 performs the following operations in a plurality of successive periods of the switch signal Vg.

If the up-enable signal u_en and the down-enable signal d_en received by the compensation module 1113 are both inactive, the switch K21 and the switch K22 are both turned off, and the upper plate voltage of the capacitor C21 remains constant, i.e., the control voltage Vc remains constant.

If the up-enable signal u_en received by the compensation module 1113 is valid and the down-enable signal d_en received by the compensation module 1113 is inactive, the switch K21 is turned on and the switch K22 is turned off. At this time, the current source CS21 charges the capacitor C21 to raise the control voltage Vc.

If the up-enable signal u_en received by the compensation module 1113 is invalid and the down-enable signal d_en received by the compensation module 1113 is valid, the switch K21 is turned off and the switch K22 is turned on. At this time, the capacitor C21 is connected in parallel to the current source CS22, and the current source CS22 provides a discharges current for the capacitor C21 to reduce the control voltage Vc.

Therefore, the compensation module 1113 generates the control voltage Vc by charging and discharging the capacitor C21 and adjusts the control voltage Vc in accordance with the up-enable signal u_en and the down-enable signal d_en.

Figure 6A:
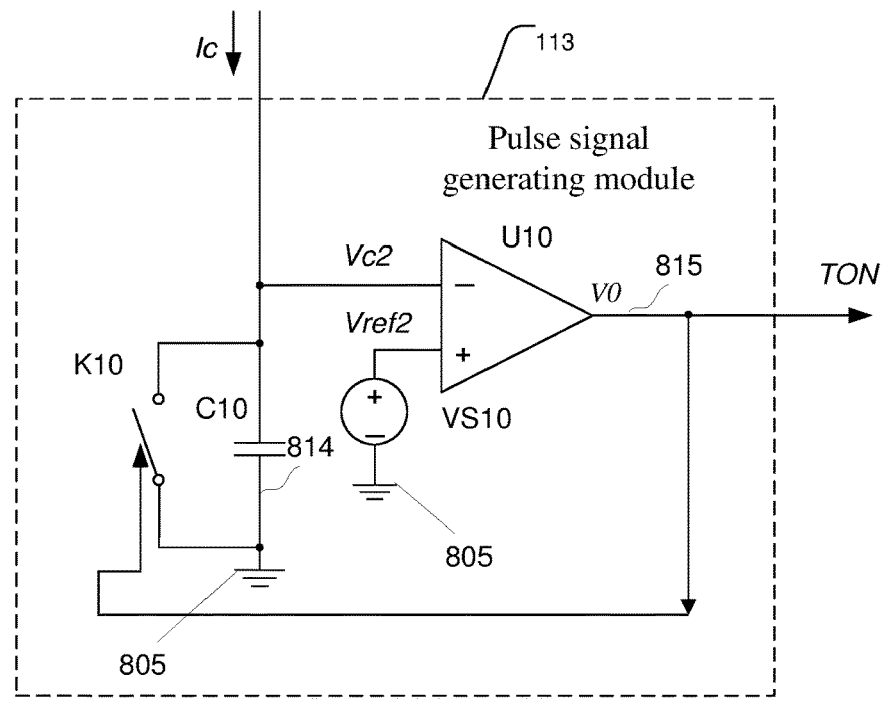
FIG. 6a is a schematic block diagram of one embodiment of a pulse signal generating module used in the control circuit shown in FIG. 2 in constant on time control mode of the switch power supply.
Figure 6B:
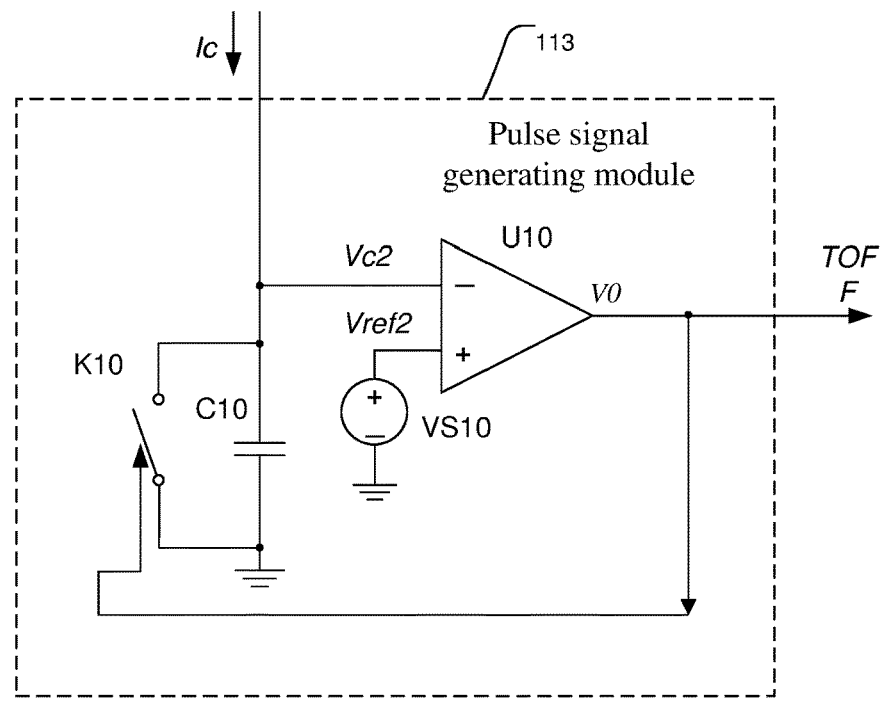
FIG. 6b is a schematic block diagram of one embodiment of a pulse signal generating module used in the control circuit shown in FIG. 2 in constant off time control mode of the switch power supply.

FIG. 6a and FIG. 6b show a pulse signal generating module 113 used in the control circuit 110 shown in FIG. 3 in constant on time control mode and in constant off time control mode of the switch power supply, respectively.

As shown in FIG. 6a and FIG. 6b, the pulse signal generating module 113 includes a comparator U10, a voltage source VS10, a current source CS10, a capacitor C10, and a switch K10.

The first terminal 813 of the capacitor C10 receives a charging current Ic and the second terminal 814 of the capacitor C10 is grounded. A control voltage Vc2 is generated across the capacitor C10. The switch K10 is connected in parallel with the capacitor C10 and is turned on and turned off under the control of the switch signal Vg.

In constant on time control mode, the output terminal 815 of the comparator U10 outputs a switch turn-on signal TON; In constant off time control mode, the output terminal 815 of the comparator U10 outputs a switch turn-on signal TOFF; the switch turn-on signal TON and switch turn-on signal TOFF is input to the driving module 115, and the driving module 115 outputs the switch signal Vg.

The inverting input terminal of the comparator U10 is connected to the first terminal 814 of the capacitor C10 to receive the control voltage Vc2, and the noninverting input terminal is connected to the voltage source VS10 to receive the reference voltage Vref2.

The working principle of the control circuit in constant on time control mode of the switch power supply is mainly described below.

During the operation of the control circuit 110, the pulse signal generating module 113 and the driving module 115 perform the following operations in a plurality of successive periods of the switch signal Vg.

At time t1, the switch signal Vg generated by the driving module 115 is at a high level.

The switch K10 is turned off under the control of the switch signal Vg, and the capacitor C10 is charged with the charging current Ic. The control voltage Vc2 generated by the common node of the current source CS 10 and the capacitor C10 is gradually increased.

The comparator U10 compares the control voltage Vc2 with the reference voltage Vref2 and generates a switch turn-on signal TON. When the control voltage Vc2 is smaller than the reference voltage Vref2, the switch turn-on signal TON maintains at the high level.

At time t2, the control voltage Vc2 rises to the reference voltage Vref2, the switch turn-on signal TON generated by the comparator U10 translates from the high level to the low level.

The time period of t1 to t2 is the on time Tn of the switch signal Vg. The falling edge of the switch turn-on signal TON is detected by driving module 115 so that the switch signal Vg translates from the high level to the low level.

In the plurality of successive periods of the switch signal Vg, the pulse signal generating module 113 and the driving module 115 repeat the above process. In the off time If of the switch signal Vg, the capacitor C10 discharges to zero voltage. In the on time In of the switch signal Vg, the current source CS10 charges the capacitor C10.

Therefore, the switch signal Vg generated by the driving module 115 is a Pulse Width Modulation (PWM) signal. The high level stage of the switch signal Vg corresponds to the on time Tn of the switching transistor M1 of the main circuit 101, and the low level stage corresponds to the off time Tf of the switching transistor M1 of the main circuit 101. The period T of the switch signal Vg is equal to the sum of the on time Tn and the off time Tf.

In the ideal case, the period T of the switch signal Vg is substantially constant. However, the period T of the switch signal Vg may be unstable due to the influence of the factors such as the delay of the comparator U10 in the pulse signal generating module 113. The prior control circuit 110 shown in FIG. 3 uses the adjustment module 111 to generate a reference period signal Tref based on the switch signal Vg. The reference period signal Tref triggered in synchronism with the switch signal is a pulse signal which has a reference period. The reference period signal Tref is used to compare with the switch signal Vg to indicate the difference between the two periods, and the control voltage Vc is further generated from the reference period signal Tref. The control voltage Vc is used to correct the charging current Ic supplied from the current source module 112 so that the period T of the switch signal Vg is substantially constant.

The above-mentioned prior control circuit can realize fixed frequency switch control. However, in constant on time control mode of the switch power supply, the minimum off time Tf_min of the control circuit is determined by the execution time and the detection time of each module of the control circuit. When the period of the switch signal Vg is constant, the maximum duty ratio Dmax of the switch signal Vg is equal to 1-Tf_min/T, so the maximum duty ratio is limited by the minimum off time Tf_min. In constant off time control mode of the switch power supply, the minimum on time Tn_min of the control circuit is determined by the execution time and the detection time of each module of the control circuit. When the period of the switch signal Vg is constant, the minimum duty ratio Dmin of the switch signal Vg is equal to Tn_min/T, so the minimum duty ratio is limited by the minimum off time Tn_min.

Further, the range of the input voltage and the output voltage of the switch power supply 100 is limited by the maximum duty ratio Dmax and the minimum duty ratio Dmin since the duty ratio has a certain relationship with the input voltage Vin and the output voltage Vout. For example, in the Buck circuit, Vout=Vin*D, when the system requires the output voltage Vout is greater than the product of the maximum duty ratio Dmax and the maximum input voltage Vin_max, the system required output voltage can't realize by the above prior control voltage due to the fixed Dmax. And in the Boost circuit, Vout=Vin/D, when the system requires the output voltage Vout is small than the ratio of the minimum input voltage Vin_min and the maximum duty ratio Dmax, the system required output voltage can't realize by the above prior control voltage due to the fixed Dmax.

Figure 7:
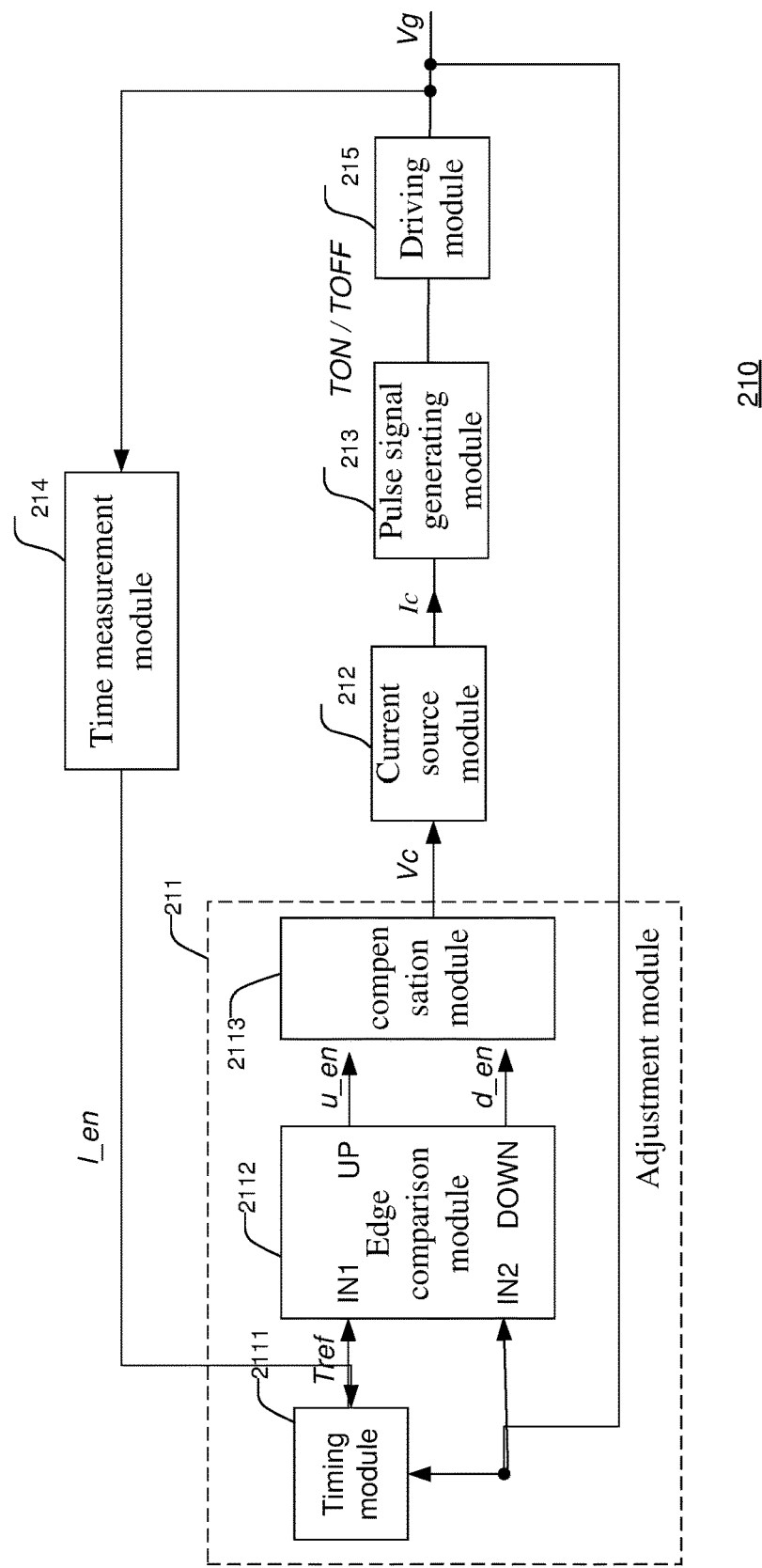
FIG. 7 is a schematic block diagram of one embodiment of a control circuit of the switch power supply according to a first embodiment of the disclosure.

FIG. 7 is a schematic block diagram of a control circuit 210 of the switch power supplies 100/200 according to a first embodiment of the disclosure. As shown in FIG. 7, the control circuit 210 includes an adjustment module 211, a current source module 212, a pulse signal generating module 213, a time measurement module 214 and a drive module 215. The adjustment module 211 generates the control voltage Vc based on the switch signal Vg. The current source module 212 produces the charging current Ic according to the control voltage Vc. In constant on time control mode, the pulse signal generating module 213 generates the switch turn-on signal TON in accordance with the charging current Ic. The drive module 215 produces the switch signal Vg based on the switch turn-on signal TON.

The structure and function of the current source module 212, the pulse signal generating module 213 and drive module 215 of the switch power supply control circuit in this embodiment are the same as the current source module 112, the pulse signal generating module 113 and drive module 115 in the control circuit 110 shown in FIG. 3. Embodiments of the adjustment module 211 and the time measurement module 214 are described below.

The adjustment module 211 includes a timing module 2111, an edge comparison module 2112, and a compensation module 2113. The timing module 2111 receives the switch signal Vg and generates a reference period signal Tref based on the switch signal Vg. The input terminals IN1 and IN2 of the edge comparison module 2112 receive the reference period signal Tref and the switch signal Vg, respectively. A up-enable signal u_en and a down-enable signal d_en are obtained by comparing the reference period signal Tref with the switch signal Vg. The compensation module 2113 is used to produce the control voltage Vc and adjust the control voltage Vc in accordance with the up-enable signal u_en or a down-enable signal d_en.

In constant on time control mode of the switch power supply 200, the time measurement module 214 is used to detect the off time Tf of the switch signal Vg. A period adjustment signal 1_en generated by the off time Tf of the switch signal Vg is used to control the reference period of the adjustment module 211.

In one embodiment, the time measurement module 214 comprises a pulse width measurement circuit and a comparator. The pulse width measurement circuit is used to measure the low level duration of the switch signal Vg to obtain the off time Tf of the switch signal Vg. The comparator compares the off time Tf with the first threshold Tth1, and generates the period adjustment signal 1_en. Such as when the first threshold Tth1 is equal to or greater than the minimum off time Tf_min:

When the off time Tf of the switch signal Vg is smaller than the first threshold Tth1, the period adjustment signal 1_en generated by the time measurement module 214 makes the reference period of the timing module 2111 increase. Therefore, the control circuit 210 compensates the change of the off time of the switch signal by dynamically controlling the reference period, which can further improve the maximum value of duty ratio Dmax to realize a wide input and output voltage range.

Further, when the off time Tf of the switch signal Vg is greater than or equal to the first threshold Tth1, the frequency of the switch signal Vg is further increased by the control circuit. The period adjustment signal 1_en generated by the time measurement module 214 makes the reference period of the timing module 2111 reduce. Thus, when the off time Tf of the switch signal Vg is equal to or greater than the minimum off time Tf_min, the frequency of the switch signal is further increased by the control circuit 210, and the system efficiency is improved and the generation of the audio noise is avoided.

In constant off time control mode of the switch power supply, the time measurement module 214 is used to detect the on time Tn of the switch signal Vg. A period adjustment signal 1_en generated by the off time Tn of the switch signal Vg is used to control the reference period of the adjustment module 211.

In one embodiment, the time measurement module 214 comprises the pulse width measurement circuit and the comparator. The pulse width measurement circuit is used to measure the high level duration of the switch signal Vg to obtain the on time Tn of the switch signal Vg. The comparator compares the on time Tf with the second threshold Tth2, and generates the period adjustment signal 1_en. Such as when the second threshold Tth2 is equal to or greater than the minimum on time Tn_min:

When the on time Tn of the switch signal Vg is smaller than the second threshold Tth2, the period adjustment signal 1_en generated by the time measurement module 214 makes the reference period of the timing module 2111 increase. Therefore, the control circuit 210 compensates the change of the on time of the switch signal by dynamically controlling the reference period, which can further reduce the minimum value of duty ratio Dmin to realize a wide input and output voltage range.

Further, when the on time Tf of the switch signal Vg is greater than or equal to the second threshold Tth2, the frequency of the switch signal Vg is further increased by the control circuit. The period adjustment signal 1_en generated by the time measurement module 214 makes the reference period of the timing module 2111 reduce. Thus, when the on time Tn of the switch signal Vg is equal to or greater than the minimum on time Tn_min, the frequency of the switch signal is further increased by the control circuit 210, and the system efficiency is improved and the generation of the audio noise is avoided.

Figure 8:
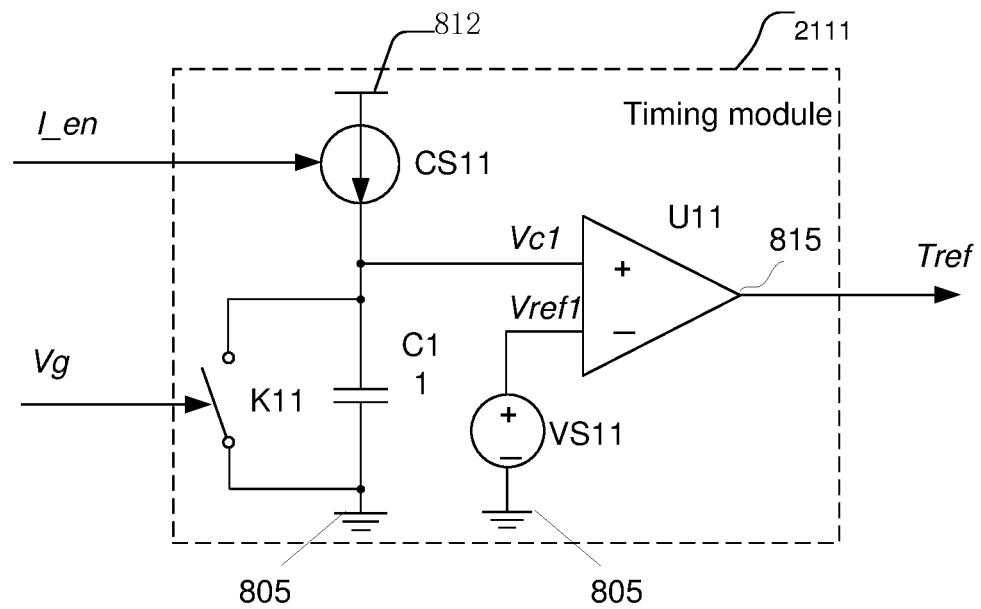
FIG. 8 is a schematic block diagram of one embodiment of a timing module used in the control circuit shown in FIG. 7.

FIG. 8 shows a timing module 2111 employed in the control circuit 210 shown in FIG. 7. As shown in FIG. 8, the timing module 2111 includes a comparator U11, a voltage source VS11, a current source CS11, a capacitor C11, and a switch K11.

The current source CS11 and the capacitor C11 are connected in series between the supply terminal 812 and the ground 805, and the common node of the current source CS11 and the capacitor C11 generates a control voltage Vc1. The switch K11 is connected in parallel with the capacitor C11 and is turned on and turned off under the control of the switch signal Vg.

The noninverting input terminal of the comparator U11 is connected to the common node of the current source CS11 and the capacitor C11 to receive the control voltage Vc1, and the inverting input terminal is connected to the voltage source VS11 to receive the reference voltage Vref1. The output terminal 815 of the comparator U11 is connected to the edge comparison module 2112 to provide the reference period signal Tref to the edge comparison module 2112.

The difference of the circuit structure between the timing module 2111 of the switch power supply control circuit 210 in this embodiment and the corresponding module in the prior control circuit 110 of the switch power supply shown in FIG. 4 is the current source CS11 is a controlled current source that changes the current according to the period adjustment signal 1_en.

Further, the current source CS11 changes the current in accordance with the period adjustment signal 1_en.

When the period adjustment signal 1_en is valid, the current of the current source CS11 decreases, and the charging time of the capacitor C11 becomes longer and the reference period is increased. Accordingly, the adjustment module 111 makes the control voltage Vc increase so that the charging current Ic generated by the current source module 112 is reduced. Thus, the purpose of increasing the switch period T is achieved.

When the period adjustment signal 1_en is invalid, the current of the current source CS11 remains constant, and the constant frequency switch control is realized or the current is increased. When the current is increased, the charging time of the capacitor C11 becomes short and the reference period is reduced. Accordingly, the adjustment module 111 makes the control voltage Vc reduce so that the charging current Ic generated by the current source module 112 is increased. Thus, the purpose of reducing the switch period T is achieved.

Figure 9:
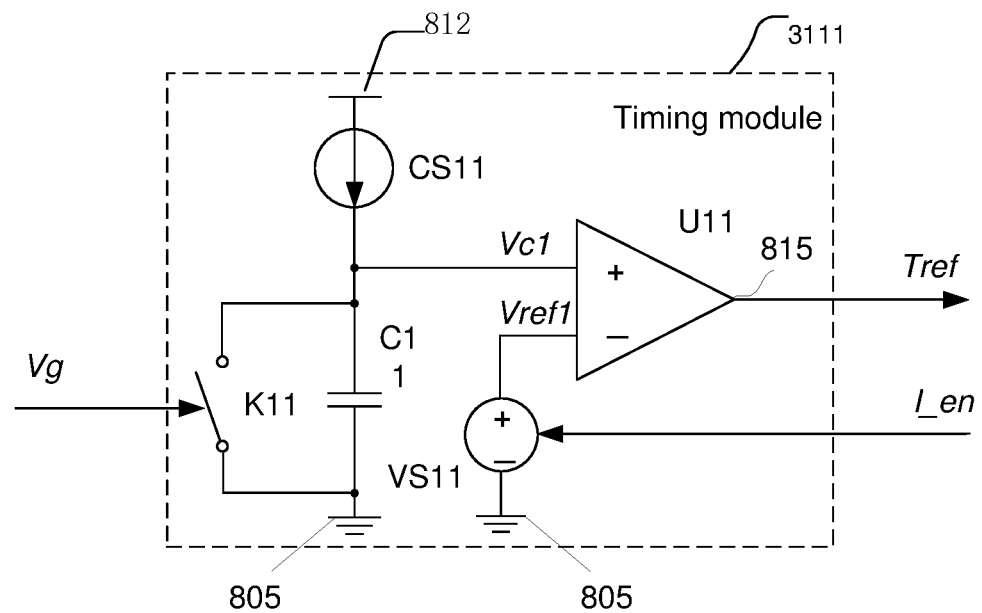
FIG. 9 is a schematic block diagram of another embodiment of a timing module used in the control circuit shown in FIG. 7.

FIG. 9 shows another timing module employed in the control circuit shown in FIG. 7. As shown in FIG. 9, the timing module 3111 includes a comparator U11, a voltage source VS11, a current source CS11, a capacitor C11, and a switch K11.

The current source CS11 and the capacitor C11 are connected in series between the supply terminal 812 and the ground 805, and the common node of the current source CS11 and the capacitor C11 generates a control voltage Vc1. The switch K11 is connected in parallel with the capacitor C11 and is turned on and turned off under the control of the switch signal Vg.

The noninverting input terminal of the comparator U11 is connected to the common node of the current source CS11 and the capacitor C11 to receive the control voltage Vc1, and the inverting input terminal is connected to the voltage source VS11 to receive the reference voltage Vref1. The output terminal 815 of the comparator U11 is connected to the edge comparison module 2112 to provide the reference period signal Tref to the edge comparison module 2112.

The difference of the circuit structure between the timing module 3111 of the switch power supply control circuit 210 in this embodiment and the corresponding module in the prior control circuit 110 of the switch power supply shown in FIG. 4 is the voltage source VS11 is a controlled voltage source that changes the voltage according to the period adjustment signal 1_en.

Further, the current source CS11 changes the current in accordance with the period adjustment signal 1_en.

When the period adjustment signal 1_en is valid, the current of the current source CS11 decreases, and the charging time of the capacitor C11 becomes longer and the reference period is increased. Accordingly, the adjustment module 111 makes the control voltage Vc increase so that the charging current Ic generated by the current source module 112 is reduced. Thus, the purpose of increasing the switch period T is achieved.

When the period adjustment signal 1_en is invalid, the current of the current source CS11 remains constant, and the constant frequency switch control is realized or the current is increased. When the current is increased, the charging time of the capacitor C11 becomes shorter and the reference period is reduced. Accordingly, the adjustment module 111 makes the control voltage Vc reduce so that the charging current Ic generated by the current source module 112 is increased. Thus, the purpose of reducing the switch period T is achieved.

Further, the voltage source VS11 changes the current in accordance with the period adjustment signal 1_en.

When the period adjustment signal 1_en is valid, the voltage of the voltage source VS11 increases, and the charging time of the capacitor C11 becomes longer and the reference period is increased. Accordingly, the adjustment module 111 makes the control voltage Vc increase so that the charging current Ic generated by the current source module 112 is reduced. Thus, the purpose of increasing the switch period T is achieved.

When the period adjustment signal 1_en is invalid, the voltage of the voltage source VS11 remains constant, and the constant frequency switch control is realized or the current is reduced. When the current is reduced, the charging time of the capacitor C11 becomes short and the reference period is reduced. Accordingly, the adjustment module 111 makes the control voltage Vc reduce so that the charging current Ic generated by the current source module 112 is increased. Thus, the purpose of reducing the switch period T is achieved.

Figure 10:
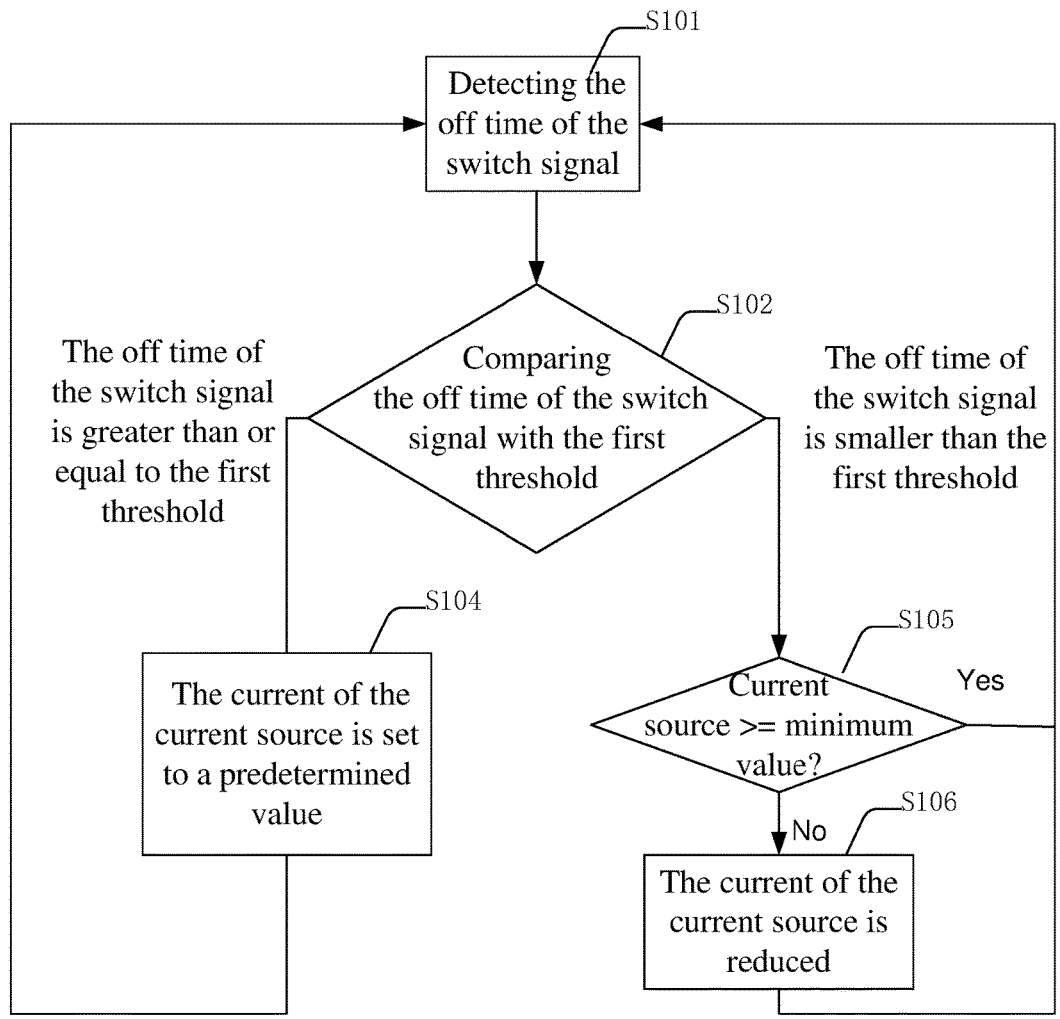
FIG. 10 is a flow chart of one embodiment of a constant on time control method of the switch power supply according to a second embodiment of the disclosure.

FIG. 10 is a flow chart of a constant on time control method of the switch power supply according to a second embodiment of the disclosure. In this embodiment, the control method is realized by using the control circuit 210 shown in FIG. 7 and the timing module 2111 shown in FIG. 8 after the switch power supply 100/200 is powered on. The control method performs some but not all of the functions of the control circuit 210.

In step S101, the off time Tf of the switch signal Vg is detected.

In step S102, the control circuit 210 decides whether the off time Tf of the switch signal is smaller than the first threshold Tth1. For example, the first threshold Tth1 corresponds to the minimum off time Tf_min of the system. If the off time Tf of the switch signal Vg is smaller than the first threshold Tth1, step S105 is executed, and if the off time Tf of the switch signal Vg is greater than or equal to the first threshold Tth1, step S104 is executed.

In step S104, the current of the current source CS11 in the timing module 2111 is set to a predetermined value. The charging time of the capacitor C11 in the timing module 2111 is substantially constant so that the reference period of the timing module 2111 is substantially constant. The control circuit 210 is controlled in the fixed frequency switch control method.

In step S105, control circuit 210 decides whether the current of the current source CS11 has reached the minimum value. If so, the adjustment of the current source CS11 in the timing module 2111 is discarded and the method proceeds to step S101. If not, step S106 is executed. The minimum current of the current source CS11 determines the maximum value of the reference period of the timing module 2111.

In step S106, the current of the current source CS11 of the timing module 2111 is reduced, and the charging time of the capacitor C11 in the timing module 2111 is extended, so the reference period of the timing module 2111 is extended. The control circuit 210 is controlled in the fixed frequency switch control method. Then, the process proceeds to step S101.

Figure 11:
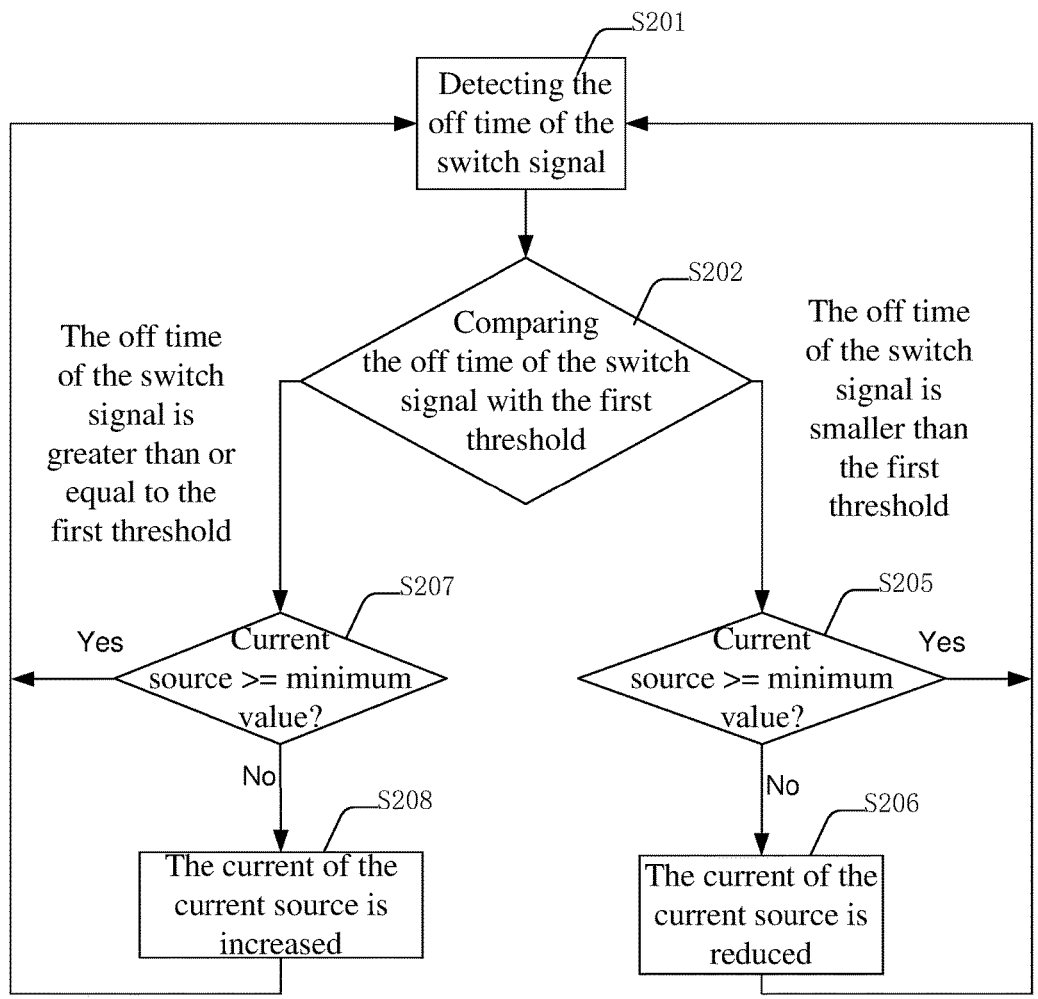
FIG. 11 is a flow chart of one embodiment of a constant on time control method of the switch power supply according to a third embodiment of the disclosure.

FIG. 11 is a flow chart of a constant on time control method of the switch power supply according to a third embodiment of the disclosure. In this embodiment, the control method is realized by using the control circuit 210 shown in FIG. 7 and the timing module 2111 shown in FIG. 8 after the switch power supply 100/200 is powered on. The control method performs some but not all of the functions of the control circuit 210.

The steps S201, S202, S205 and S206 of the switch power supply control method in this embodiment are the same as the corresponding steps S101, S102, S105 and S106 of control method shown in FIG. 10. The difference of the two is described below.

In step S202, the control circuit 210 decides whether the off time Tf of the switch signal is smaller than the first threshold Tth1. For example, the first threshold Tth1 corresponds to the minimum off time Tf_min of the system. If the off time Tf of the switch signal Vg is smaller than the first threshold Tth1, step S205 is executed, and if the off time Tf of the switch signal Vg is greater than or equal to the first threshold Tth1, step S207 is executed.

In step S207, the control circuit 210 decides whether the current of the current source CS11 in the timing module 2111 has reached the maximum value. If so, the method proceeds to step S201. If not, step S208 is executed. The maximum current of the current source CS11 determines the minimum value of the reference period of the timing module 2111.

In step S208, the current of the current source CS11 of the timing module 2111 is increased, and the charging time of the capacitor C11 in the timing module 2111 is reduced, so the reference period of the timing module 2111 is reduced. Then, the method proceeds to step S201.

Figure 12:
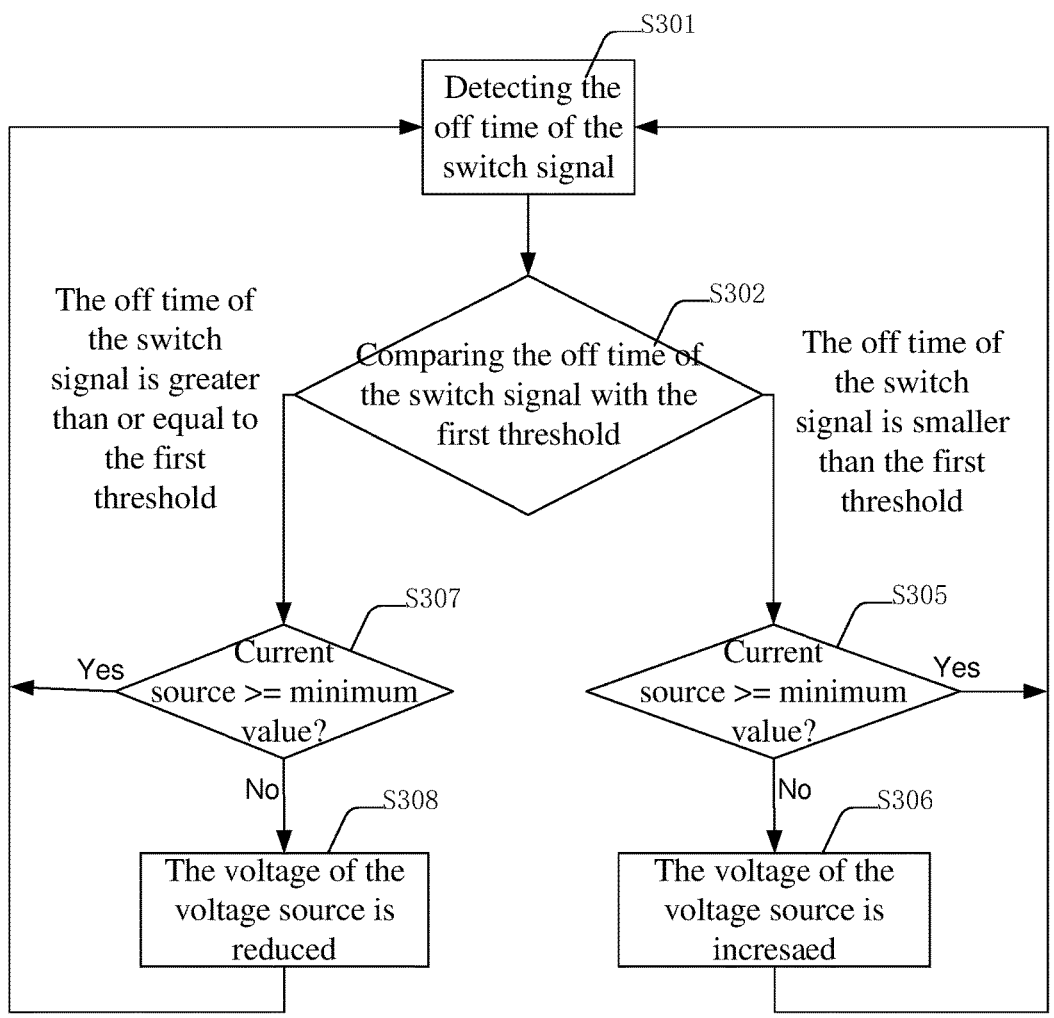
FIG. 12 is a flow chart of one embodiment of a constant on time control method of the switch power supply according to a fourth embodiment of the disclosure.

FIG. 12 is a flow chart of a constant on time control method of the switch power supply according to a fourth embodiment of the disclosure. In this embodiment, the control method is realized by using the control circuit 210 shown in FIG. 7 and the timing module 3111 shown in FIG. 9 after the switch power supply 100/200 is powered on. The control method performs some but not all of the functions of the control circuit 210.

In step S301, the off time Tf of the switch signal is detected.

In step S302, the control circuit 210 decides whether the off time Tf of the switch signal is smaller than the first threshold Tth1. For example, the first threshold Tth1 corresponds to the minimum off time Tf_min of the system. If the off time Tf of the switch signal Vg is smaller than the first threshold Tth1, step S305 is executed, and if the off time Tf of the switch signal Vg is greater than or equal to the first threshold Tth1, step S307 is executed.

In step S305, the control circuit 210 decides whether the voltage of the voltage source VS11 has reached the maximum value. If so, the adjustment of the voltage source VS11 in the timing module 3111 is discarded and the method proceeds to step S301. If not, step S306 is executed. The maximum voltage of voltage source VS11 determines the maximum value of the reference period of the timing module 3111.

In step S306, the voltage of the voltage source VS11 of the timing module 2111 is increased, and the charging time of the capacitor C11 in the timing module 2111 is extended, so the reference period of the timing module 3111 is extended. The control circuit 210 is controlled in the fixed frequency switch control method. Then, the method proceeds to step S301.

In step S307, the control circuit 210 decides whether the voltage of the voltage source VS11 has reached the minimum value. If so, the method proceeds to step S301. If not, step S308 is executed. The minimum voltage of voltage source VS11 determines the minimum value of the reference period of the timing module 3111.

In step S308, the voltage of the voltage source VS11 of the timing module 2111 is reduced, and the charging time of the capacitor C11 in the timing module 2111 is reduced, so the reference period of the timing module 3111 is reduced. Then, the method proceeds to step S301.

Figure 13:
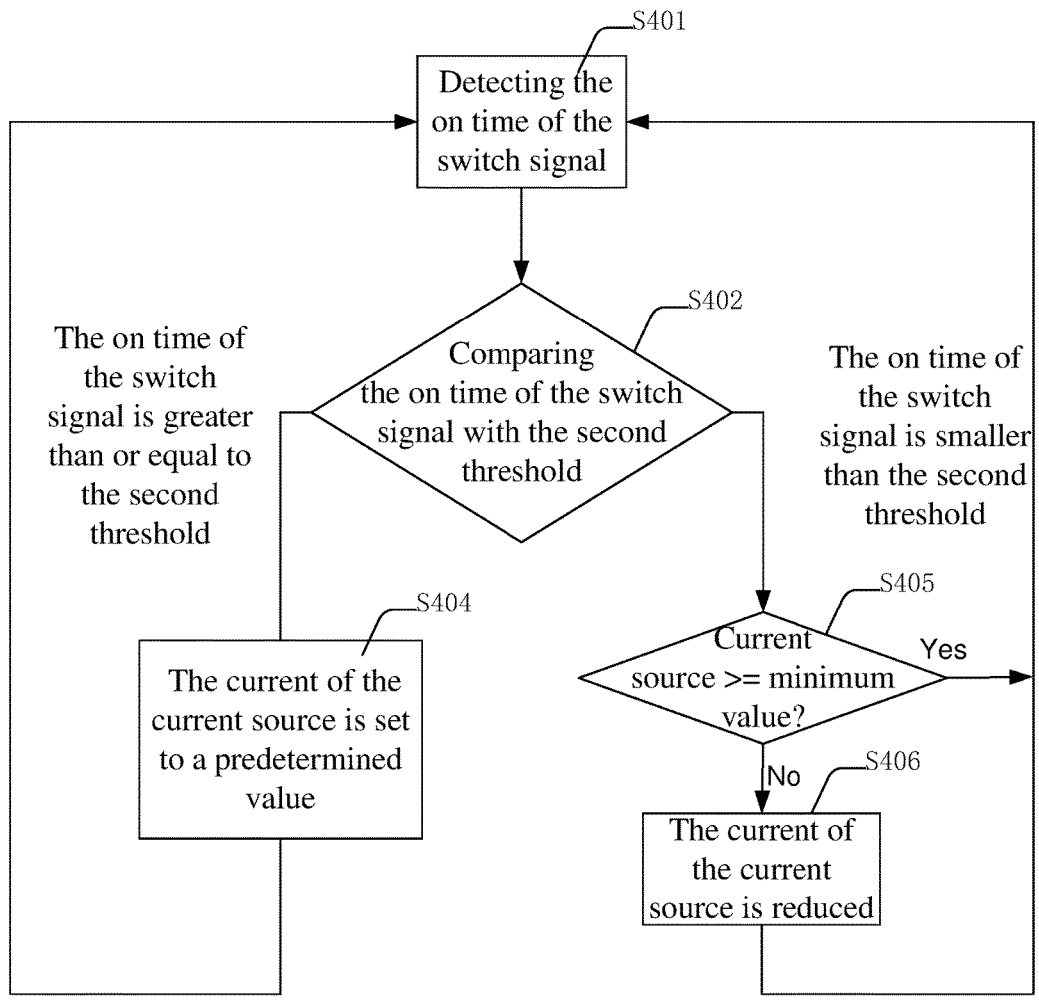
FIG. 13 is a flow chart of one embodiment of a constant off time control method of the switch power supply according to a fifth embodiment of the disclosure.

FIG. 13 is a flow chart of a constant off time control method of the switch power supply 100/200 according to a fifth embodiment of the disclosure. In this embodiment, the control method is realized by using the control circuit 210 shown in FIG. 7 and the timing module 2111 shown in FIG. 8 after the switch power supply 100/200 is powered on. The control method performs some but not all of the functions of the control circuit 210.

In step S401, the on time Tn of the switch signal is detected.

In step S402, the control circuit 210 decides whether the on time Tn of the switch signal is smaller than the second threshold Tth2. For example, the second threshold Tth2 corresponds to the minimum on time Tn_min of the system. If the on time Tn of the switch signal is smaller than the second threshold Tth2, step S405 is executed, and if the on time Tn of the switch signal is greater than or equal to the second threshold Tth2, step S404 is executed.

The steps S404 to S406 are the same as steps S104 to S106.

Figure 14:
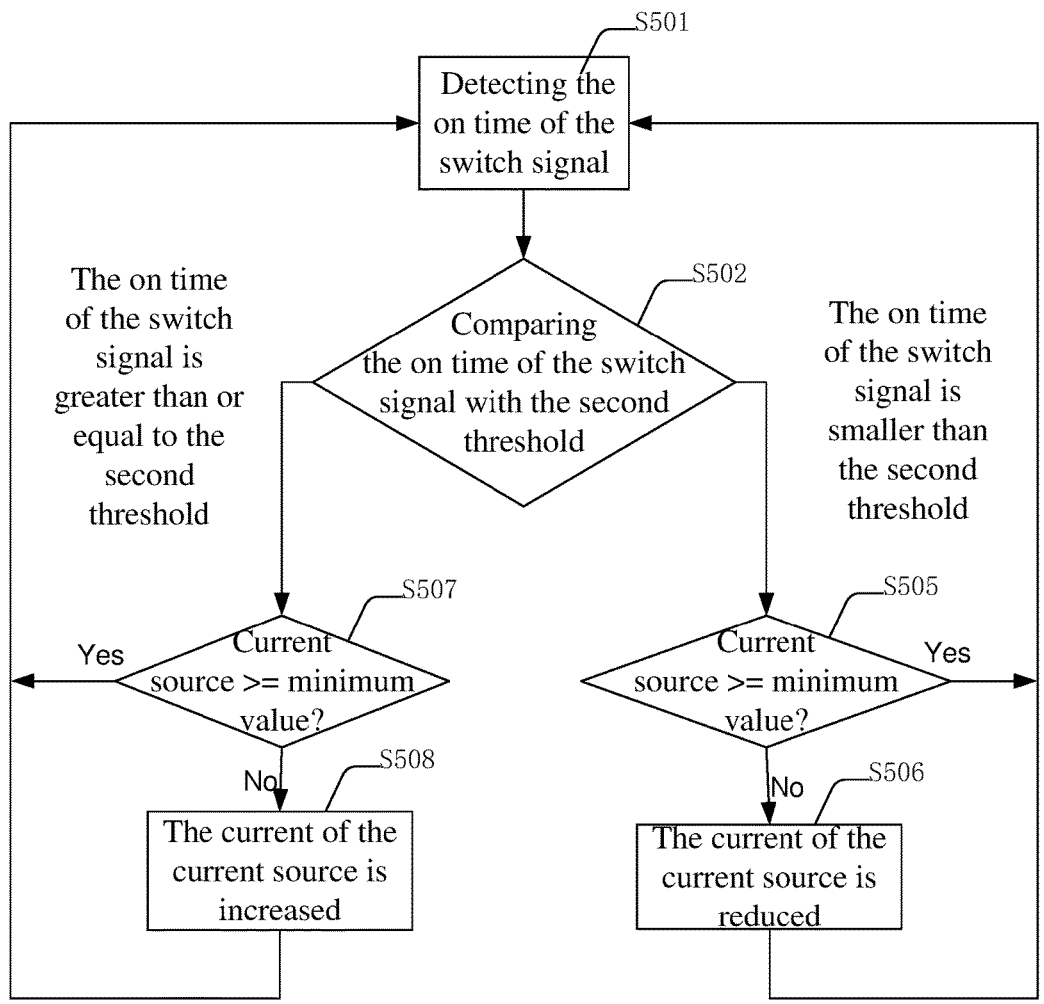
FIG. 14 is a flow chart of one embodiment of a constant off time control method of the switch power supply according to a sixth embodiment of the disclosure.

FIG. 14 is a flow chart of a constant off time control method of the switch power supply 100/200 according to a sixth embodiment of the disclosure. In this embodiment, the control method is realized by using the control circuit 210 shown in FIG. 7 and the timing module 2111 shown in FIG. 8 after the switch power supply 100/200 is powered on. The control method performs some but not all of the functions of the control circuit 210.

The steps S501, S502, S505, and S506 of the switch power supply control method in this embodiment are the same as the corresponding steps S401, S402, S405 and S406 of control method shown in FIG. 13. The difference of the two is described below.

In step S502, the control circuit 210 decides whether the on time Tn of the switch signal is smaller than the second threshold Tth2. For example, the second threshold Tth2 corresponds to the minimum on time Tn_min of the system. If the on time Tn of the switch signal is smaller than the second threshold Tth2, step S505 is executed, and if the on time Tn of the switch signal is greater than or equal to the second threshold Tth2, step S507 is executed.

In step S507, deciding whether the current of the current source CS11 in the timing module 2111 has reached the maximum value. If so, the method proceeds to step S501. If not, step S508 is executed. The maximum current of the current source CS11 determines the minimum value of the reference period of the timing module 2111.

In step S508, the current of the current source CS11 of the timing module 2111 is increased, and the charging time of the capacitor C11 in the timing module 2111 is reduced, so the reference period of the timing module 2111 is reduced. Then, the method proceeds to step S501.

Figure 15:
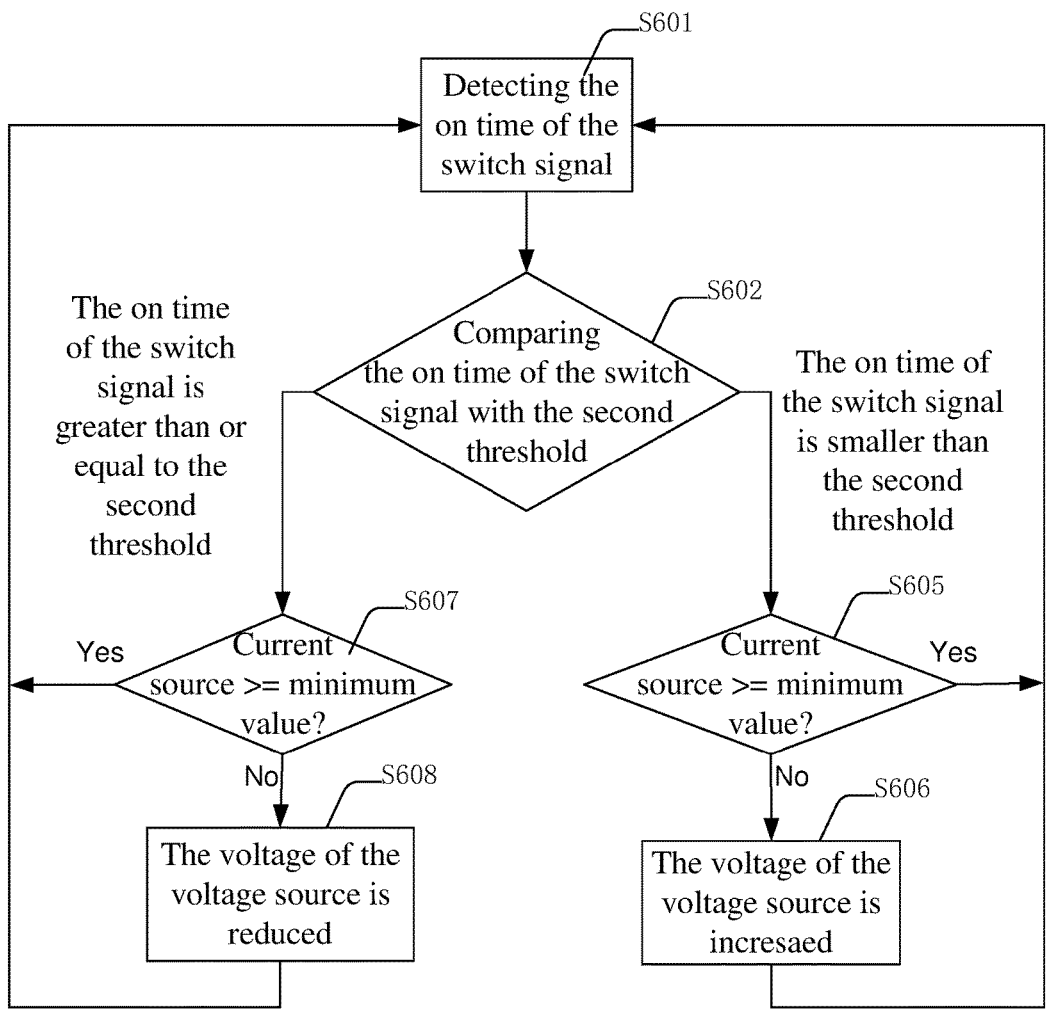
FIG. 15 is a flow chart of one embodiment of a constant off time control method of the switch power supply according to a seventh embodiment of the disclosure.

FIG. 15 is a flow chart of a constant off time control method of the switch power supply 100/200 according to a seventh embodiment of the disclosure. In this embodiment, the control method is realized by using the control circuit 210 shown in FIG. 7 and the timing module 3111 shown in FIG. 9 after the switch power supply 100/200 is powered on. The control method performs some but not all of the functions of the control circuit 210.

In step S601, the on time Tn of the switch signal is detected.

In step S602, the control circuit 210 decides whether the on time Tn of the switch signal is smaller than the second threshold Tth2. For example, the second threshold Tth2 corresponds to the minimum on time Tn_min of the system. If the on time Tn of the switch signal is smaller than the second threshold Tth2, step S605 is executed, and if the on time Tn of the switch signal is greater than or equal to the second threshold Tth2, step S607 is executed.

In step S605, the control circuit 210 decides whether voltage of the voltage source has reached the maximum value. If so, the adjustment of the voltage source VS11 in the timing module 3111 is discarded and the method proceeds to step S601. If not, step S606 is executed. The maximum voltage of voltage source VS11 determines the maximum value of the reference period of the timing module 2111.

In step S606, the voltage of the voltage source VS11 of the timing module 3111 is increased, and the charging time of the capacitor C11 in the timing module 2111 is extended, so the reference period of the timing module 3111 is extended. The control circuit 210 is controlled in the fixed frequency switch control method. Then, the method proceeds to step S601.

In step S607, the control circuit 210 decides whether the voltage of the voltage source VS11 has reached the minimum value. If so, the method proceeds to step S601. If not, step S608 is executed. The minimum voltage of voltage source VS11 determines the minimum value of the reference period of the timing module 2111.

In step S608, the voltage of the voltage source VS11 of the timing module 3111 is reduced, and the charging time of the capacitor C11 in the timing module 2111 is decreased, so the reference period of the timing module 3111 is decreased. Then, the process proceeds to step S601.

The control method of the above-described embodiment dynamically adjusts the reference period of the timing module according to the on time or the off time of the switch signal, so the off time is always greater than the minimum off time Tf_min in constant on time control mode of the switch power supply 100/200 and the on time is always greater than the minimum on time Tn_min in constant off time control mode of the switch power supply. Thus, the control method compensates the change of the time parameter of the switch signal Vg by dynamically controlling the reference period, which can further improve the maximum value of duty ratio Dmax or further reduce the minimum value of duty ratio Dmin to realize a wide input and output voltage range. The frequency of the switch signal Vg is further increased by the control circuit 210, and the system efficiency is improved and the generation of the audio noise is avoided.

It should be noted that, in this context, relational terms such as first and second are used only to distinguish an entity or operation from another entity or operation, without necessarily requiring or implying any such actual relationship or order between these entities or operations. Moreover, the term 'include,' 'comprise,' or any other variant is intended to encompass a non-exclusive inclusion, so that the process, method, article, or device that includes a series of elements comprises not only those elements themselves, but also those that are not explicitly or other elements that are inherent to such processes, methods, articles or equipment. In the absence of more restrictions, the elements defined by the statement 'including a/an . . . ' do not preclude the presence of the similar additional elements in the process, method, article or equipment.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A control circuit for a switch power supply comprising:
an adjustment module that produces a first control voltage by comparing a period of a switch signal with a reference period;
a current source module that generates a first charging current according to the first control voltage;
a pulse signal generating module that converts the first charging current into an on time signal or off time signal of a switching transistor;
a driving module that produces the switch signal according to the on time or off time signal of the switching transistor, so as to control the turning on and turning off of the switching transistor; and
a time measurement module that obtains a time parameter according to the switch signal, and generates a periodic adjustment signal according to the time parameter; and
wherein the adjustment module adjusts the reference period according to the periodic adjustment signal to adjust the period of the switch signal.

2. The control circuit according to claim 1, wherein the time measurement module comprises an off time measurement circuit for measuring an off time of the switch signal as the time parameter, and when the off time of the switch signal is less than a first threshold, the periodic adjustment signal increases the reference period.

3. The control circuit according to claim 1, wherein the time measurement module comprises an on time measurement circuit, and when said on time signal is less than a second threshold, the periodic adjustment signal increases the reference period.

4. The control circuit according to claim 1, wherein the adjustment module comprises:
a timing module that generates a reference period signal according to the switch signal, wherein the reference period signal is a pulse signal that is triggered synchronously with the switch signal;
an edge comparison module that compares the reference period signal with the switch signal to generate a first enable signal and a second enable signal; and
a compensation module that provides the first control voltage and adjusts the first control voltage in accordance with the first enable signal and the second enable signal.

5. The control circuit according to claim 4, wherein, the timing module comprises:
a first capacitor that generates a second control voltage across the first capacitor;
a first current source that is connected in series with the first capacitor for supplying a first current to the first capacitor;
a first switch that is connected in parallel with the first capacitor and controls the charging and discharging process of the first capacitor; and
a first comparator that produces the reference period signal by comparing the second control voltage with a first reference voltage;
wherein the first switch is turned on and off by the switch signal, and the timing module adjusts the reference period by changing a charging time of the first capacitor.

6. The control circuit according to claim 5, wherein, the adjustment module further comprises a first voltage source that provides the first reference voltage, wherein when the adjustment module increases the reference period, at least one of a current of the first current source is reduced and the first reference voltage is raised, and subsequently a charging time of the first capacitor is extended, and wherein when the adjustment module reduces the reference period, at least one of the current of the first current source is increased and the first reference voltage is reduced, and subsequently the charging time of the first capacitor is reduced.

7. A control method for a switch power supply comprising:
producing a first control voltage by comparing a period of a switch signal with a reference period;
generating a first charging current according to the first control voltage;

converting the first charging current into an on time signal or off time signal of a switching transistor;

producing a switch signal to control a turn on and a turn off of the switching transistor, so as to control the turning on and turning off of the switching transistor;

obtaining a time parameter according to the switch signal;

generating a periodic adjustment signal based on the time parameter; and adjusting the reference period according to the periodic adjustment signal to adjust the period of the switch signal.

8. The control method according to claim 7, wherein producing the first control signal comprises:

generating a reference period signal according to the switch signal, wherein the reference period signal is a pulse signal that is triggered synchronously with the switch signal;

comparing the reference period signal with the switch signal to generate a first enable signal and a second enable signal;

providing the first control voltage; and adjusting the first control voltage in accordance with the first enable signal and the second enable signal.

9. The control method according to claim 8, wherein generating the reference period signal comprises:

generating a second control voltage across the first capacitor;

connecting a first current source in series with the first capacitor for supplying a first current to the first capacitor;

connecting a first switch in parallel with the first capacitor for controlling the charging and discharging process of the first capacitor; and producing the reference period signal by comparing the second control voltage with a first reference voltage;

wherein the first switch is turned on and off by the switch signal, and the timing module adjusts the reference period by changing a charging time of the first capacitor.

10. The control method according to claim 7, wherein:

the time parameter is an off time of the switch signal, and when said off time is less than a first threshold, the periodic adjustment signal increases the reference period.

11. The control method according to claim 7, wherein:

the time parameter is an on time of the switch signal, and when the on time is less than a second threshold, the periodic adjustment signal increases the reference period.

12. A switch power supply comprising:

a main circuit for power conversion comprising a switching transistor;

a control circuit that controls a turn-on and a turn-off of the switching transistor with a switch signal, the control circuit comprising:

an adjustment module that produces a first control voltage by comparing a period of the switch signal with a reference period;

a current source module that generates a first charging current according to the first control voltage;

a pulse signal generating module that converts the first charging current into an on time signal or off time signal of a switch transistor;

a driving module that produces the switch signal according to the on time or off time signal of the switching transistor, so as to control the turn on and turn off signal of a switching transistor; and a time measurement module that obtains a time parameter according to the switch signal, and generates a periodic adjustment signal according to the time parameter; and wherein the adjustment module adjusts the reference period according to the periodic adjustment signal to adjust the period of the switch signal.

13. The switch power supply according to claim 12, wherein the time measurement module comprises an off time measurement circuit for measuring an off time of the switch signal as the time parameter, and when the off time of the switch signal is less than a first threshold, the periodic adjustment signal increases the reference period.

14. The switch power supply according to claim 12, wherein the time measurement module comprises an on time measurement circuit, and when said on time signal is less than a second threshold, the periodic adjustment signal increases the reference period.

15. The switch power supply according to claim 12, wherein the adjustment module comprises:

a timing module that generates a reference period signal according to the switch signal, wherein the reference period signal is a pulse signal that is triggered synchronously with the switch signal;

an edge comparison module that compares the reference period signal with the switch signal to generate a first enable signal and a second enable signal; and a compensation module that provides the first control voltage and adjusts the first control voltage in accordance with the first enable signal and the second enable signal.

16. The switch power supply according to claim 15, wherein, the timing module comprises:

a first capacitor that generates a second control voltage across the first capacitor;

a first current source that is connected in series with the first capacitor for supplying a first current to the first capacitor;

a first switch that is connected in parallel with the first capacitor and controls the charging and discharging process of the first capacitor; and a first comparator that produces the reference period signal by comparing the second control voltage with a first reference voltage;

wherein the first switch is turned on and off by the switch signal, and the timing module adjusts the reference period by changing a charging time of the first capacitor.

17. The switch power supply according to claim 16, wherein, the adjustment module further comprises a first voltage source that provides the first reference voltage, wherein when the adjustment module increases the reference period, at least one of a current of the first current source is reduced and the first reference voltage is raised, and subsequently a charging time of the first capacitor is extended, and wherein when the adjustment module reduces the reference period, at least one of the current of the first current source is increased and the first reference voltage is reduced, and subsequently the charging time of the first capacitor is reduced.

18. The switch power supply according to claim 12, wherein the main circuit is one of a boost topology, a buck topology, a buck-boost topology, and a flyback topology.

* * * * *